(12) United States Patent
Moriwaki

(10) Patent No.: US 10,109,813 B2
(45) Date of Patent: Oct. 23, 2018

(54) PHOTOELECTRIC CONVERSION ELEMENT, IMAGING DEVICE, OPTICAL SENSOR AND METHOD OF MANUFACTURING PHOTOELECTRIC CONVERSION ELEMENT

(71) Applicant: SONY CORPORATION, Tokyo (JP)

(72) Inventor: Toshiki Moriwaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/325,144

(22) PCT Filed: Apr. 21, 2015

(86) PCT No.: PCT/JP2015/062044
§ 371 (c)(1),
(2) Date: Jan. 10, 2017

(87) PCT Pub. No.: WO2016/009693
PCT Pub. Date: Jan. 21, 2016

(65) Prior Publication Data
US 2017/0162807 A1    Jun. 8, 2017

(30) Foreign Application Priority Data
Jul. 17, 2014    (JP) .................................. 2014-147147

(51) Int. Cl.
*H01L 51/42* (2006.01)
*H01L 51/44* (2006.01)
(Continued)

(52) U.S. Cl.
CPC ...... *H01L 51/4206* (2013.01); *H01L 51/0008* (2013.01); *H01L 51/0029* (2013.01);
(Continued)

(58) Field of Classification Search
CPC . H01L 51/4206; H01L 51/442; H01L 51/424; H01L 51/0008; H01L 51/0029;
(Continued)

(56) References Cited

U.S. PATENT DOCUMENTS

2008/0035965 A1    2/2008  Hayashi et al.
2011/0031481 A1*   2/2011  Von Wrochem ...... H01L 51/002
                                                             257/40

(Continued)

FOREIGN PATENT DOCUMENTS

JP    2008-72090 A    3/2008
JP    2014-120616 A   6/2014

OTHER PUBLICATIONS

International Search Report prepared by the Japan Patent Office dated Jul. 1, 2015, for International Application No. PCT/JP2015/062044.

(Continued)

*Primary Examiner* — Dao H Nguyen
(74) *Attorney, Agent, or Firm* — Sheridan Ross P.C.

(57) ABSTRACT

To provide an organic photoelectric conversion element, imaging device, and optical sensor having low dark currents, and a method of manufacturing a photoelectric conversion element. Provided is a photoelectric conversion element, including: a first electrode; an organic photoelectric conversion layer disposed in a layer upper than the first electrode, the organic photoelectric conversion layer including one or two or more organic semiconductor materials; a buffer layer disposed in a layer upper than the organic photoelectric conversion layer, the buffer layer including an amorphous inorganic material and having an energy level of 7.7 to 8.0 eV and a difference in a HOMO energy level from the (Continued)

organic photoelectric conversion layer of 2 eV or more; and a second electrode disposed in a layer upper than the buffer layer.

20 Claims, 5 Drawing Sheets

(51) Int. Cl.
*H01L 51/00* (2006.01)
*H01L 51/52* (2006.01)

(52) U.S. Cl.
CPC ........ H01L 51/0032 (2013.01); H01L 51/424 (2013.01); H01L 51/442 (2013.01)

(58) Field of Classification Search
CPC ............... H01L 51/0032; H01L 27/308; H01L 27/14663
USPC ............. 257/40, 79, 431, E51.022, E51.025, 257/E51.026, E31.042; 438/46, 59, 82; 136/255, 256, 263
See application file for complete search history.

(56) References Cited

U.S. PATENT DOCUMENTS

| | | | | |
|---|---|---|---|---|
| 2011/0095271 | A1* | 4/2011 | Bradley | H01L 51/5048 257/40 |
| 2013/0134409 | A1* | 5/2013 | Nihei | C07D 277/20 257/40 |
| 2015/0162384 | A1* | 6/2015 | Couture | H01L 27/308 257/40 |
| 2015/0340634 | A1* | 11/2015 | Forrest | H01L 51/4253 136/255 |
| 2016/0197281 | A1* | 7/2016 | Momose | H01L 51/441 136/256 |
| 2017/0077429 | A1* | 3/2017 | Huang | H01L 51/426 |

OTHER PUBLICATIONS

Official Action (with English translation) for Chinese Patent Application No. 201580027505.X dated Feb. 5, 2018, 13 pages.

* cited by examiner

PHOTOELECTRIC CONVERSION ELEMENT, IMAGING DEVICE, OPTICAL SENSOR AND METHOD OF MANUFACTURING PHOTOELECTRIC CONVERSION ELEMENT

CROSS REFERENCE TO RELATED APPLICATIONS

This application is a national stage application under 35 U.S.C. 371 and claims the benefit of PCT Application No. PCT/JP 2015/062044 having an international filing date of 21 Apr. 2015, which designated the United States, which PCT application claimed the benefit of Japanese Patent Application No. 2014-147147 filed 17 Jul. 2014, the disclosures of which are incorporated herein by reference in their entirety.

TECHNICAL FIELD

The present technology relates to a photoelectric conversion element, an imaging device and optical sensor including this photoelectric conversion element, and a method of manufacturing a photoelectric conversion element. More particularly, the present technology relates to an organic photoelectric conversion element, imaging device, and optical sensor including an organic photoelectric conversion material, and a method of manufacturing an organic photoelectric conversion element.

BACKGROUND ART

Conventionally, as an imaging element (image sensor), there is mainly used a semiconductor element having a structure of a charge coupled device (CCD) or a complementary metal oxide semiconductor (CMOS). Also, there is recently proposed an imaging element including an organic photoelectric conversion element having a photoelectric conversion layer formed with an organic semiconductor material (for example, see Patent Literatures 1 to 3). The organic photoelectric conversion element does not need to contain a color filter, and can have a structure and a manufacturing process which are simpler than those of the conventional inorganic semiconductor element.

The conventional organic photoelectric conversion element as described in Patent Literatures 1 to 3 has a configuration in which an organic photoelectric conversion portion is disposed between a pair of electrodes. For example, a lower electrode, an organic photoelectric conversion portion, and an upper electrode are laminated in this order on a substrate. Also, the conventional organic photoelectric conversion element includes various intermediate layers such as an electron blocking layer, a buffer layer and an active layer, between the organic photoelectric conversion portion and each electrode in some cases.

CITATION LIST

Patent Literature

Patent Literature 1: JP 2013-219190A
Patent Literature 2: JP 2014-063999A
Patent Literature 3: JP 2014-072328A

SUMMARY OF INVENTION

Technical Problem

A photoelectric conversion element is required to have high conversion efficiency and low dark currents. However, the previously-described conventional organic photoelectric conversion element has a problem that suppression of dark currents is not sufficient.

Therefore, a main object of the present disclosure is to provide an organic photoelectric conversion element, imaging device, and optical sensor having low dark currents, and a method of manufacturing a photoelectric conversion element.

Solution to Problem

A photoelectric conversion element according to the present disclosure includes: a first electrode; an organic photoelectric conversion layer disposed in a layer upper than the first electrode, the organic photoelectric conversion layer including one or two or more organic semiconductor materials; a buffer layer disposed in a layer upper than the organic photoelectric conversion layer, the buffer layer including an amorphous inorganic material and having an energy level of 7.7 to 8.0 eV and a difference in a HOMO energy level from the organic photoelectric conversion layer of 2 eV or more; and a second electrode disposed in a layer upper than the buffer layer. The buffer layer may be formed with two or more metal oxides, for example. In that case, at least one of the metal oxides may be a metal oxide semiconductor. Further, the buffer layer may be formed with two or more metal oxides selected from the group consisting of zinc oxide, silicon oxide, tin oxide, niobium oxide, titanium oxide, molybdenum oxide, aluminum oxide, In—Ga—Zn-based oxides (IGZO), magnesium oxide and hafnium oxide. The buffer layer may be constituted by a plurality of layers each having a different energy level. The buffer layer may have a thickness of 3 to 300 nm, for example. The buffer layer may have a surface resistance of 100 kΩ/□ or more. The second electrode may be formed with a transparent material. In that case, the buffer layer may also be formed with a transparent material, and may have a relative refractive index to the second electrode of 0.3 or less. The buffer layer may be formed by a sputtering method, for example.

An imaging device according to the present disclosure includes the above-mentioned photoelectric conversion element. Further, an optical sensor according to the present disclosure includes the above-mentioned photoelectric conversion element, and may be, for example, an infrared sensor.

A method of manufacturing a photoelectric conversion element according to the present disclosure includes a step of forming a first electrode; a step of forming, in a layer upper than the first electrode, an organic photoelectric conversion layer including one or two or more organic semiconductor materials; a step of forming, in a layer upper than the organic photoelectric conversion layer, a buffer layer including an amorphous inorganic material and having an energy level of 7.7 to 8.0 eV and a difference in a HOMO energy level from the organic photoelectric conversion layer of 2 eV or more; and a step of forming, in a layer upper than the buffer layer, a second electrode. A sputtering method may be applied to the step of forming a buffer layer. In that case, a film of the buffer layer may be formed while introducing oxygen.

Advantageous Effects of Invention

According to the present disclosure, a high energy barrier can be formed to enhance a suppression effect of dark currents. It is noted that the effects described herein are not necessarily limiting, and any one of the effects described in the present disclosure may be exerted.

DESCRIPTION OF EMBODIMENT(S)

Hereinafter, embodiments for carrying out the present disclosure will be described in detail with reference to the accompanying drawings. It is noted that the present disclosure is not limited to the embodiments indicated blow. Also, description will be provided in the following order.
1. First Embodiment
(Example of Photoelectric Conversion Element Including Inorganic Buffer Layer)
2. Second Embodiment
(Example of Photoelectric Conversion Element Including Buffer Layer Having Laminated Structure)
3. Third Embodiment
(Example of Imaging Device Including Photoelectric Conversion Element Containing Inorganic Buffer Layer)

1. First Embodiment

Figure 1:
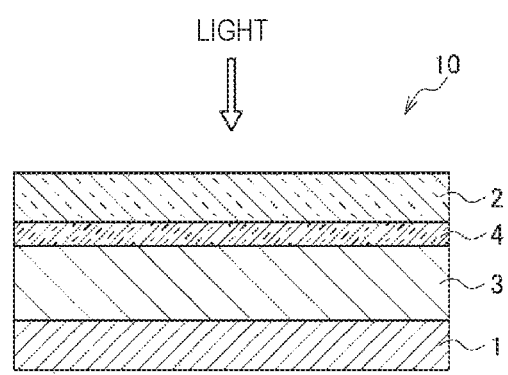
FIG. 1 is a schematic diagram illustrating a configuration of a photoelectric conversion element according to a first embodiment of the present disclosure.

Firstly, a photoelectric conversion element according to a first embodiment of the present disclosure will be described. FIG. 1 is a cross-sectional diagram schematically illustrating a configuration of the photoelectric conversion element according to the first embodiment of the present disclosure. As illustrated in FIG. 1, a photoelectric conversion element 10 includes an organic photoelectric conversion layer 3 and a buffer layer 4 between a pair of electrodes 1 and 2.
[Electrodes 1 and 2]
The electrodes 1 and 2 can be formed with a transparent material having conductivity, such as indium-tin oxides (including ITO, Sn-doped $In_2O_3$, crystalline ITO and amorphous ITO), IFO (F-doped $In_2O_3$), tin oxide ($SnO_2$), ATO (Sb-doped $SnO_2$), FTO (F-doped $SnO_2$), zinc oxide (including Al-doped ZnO, B-doped ZnO, and Ga-doped ZnO), indium oxide-zinc oxide (IZO), titanium oxide ($TiO_2$), spinel-shaped oxides, and oxides having a $YbFe_2O_4$ structure. Here, the "transparent material" indicates a material that does not excessively absorb light incident on the organic photoelectric conversion layer 3. This also applies to the following description.

Also, of the electrodes 1 and 2, the electrode on which light is not incident may be low in transparency. In this case, the electrode can also be formed with a metal material such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co) and molybdenum (Mo), and an alloy material containing these metal elements.

It is noted that the electrodes 1 and 2 may be formed with a conductive material such as conductive particles containing the previously-described metal and metal alloy, impurities-containing polysilicon, carbon-based materials, oxide semiconductors, carbon nanotubes and graphene. In that case, the electrode may be formed by mixing these conductive materials to a binder resin and curing the resultant paste and ink. Also, the electrodes 1 and 2 can be formed with a conductive polymer material such as poly(3,4-ethylenedioxythiophen) and polystyrene sulfonate. Furthermore, the electrodes 1 and 2 can also have a structure in which two or more layers formed with different materials are superimposed on each other.
[Organic Photoelectric Conversion Layer 3]
The organic photoelectric conversion layer 3 can be formed with one or two or more organic semiconductor materials. The organic semiconductor materials to be used here may be any material that can convert light energy into electric energy, and is particularly desirably a p-type organic semiconductor material. Here, among various organic semiconductor materials, examples of a material that is reactive to green color (approximately 490 to 580 nm) may include Pigment Violet 1, 3, 4, 5, 5:1, 19 (quinacridone), 23, 27, 29, 31, 32, 33, 34, 35, 36, 37, 38, 40, 42, 43, 44, and 50, and Pigment Red 1, 2, 4, 5, 6, 7, 8, 9, 12, 13, 17, 21, 22, 23, 24, 31, 32, 38, 48, 49, 50, 51, 52, 53, 54, 64, 68, 88, 112, 113, 114, 122, 146, 147, 148, 149, 150, 151, 168, 170, 171, 173, 174, 175, 176, 177, 178, 179, 181, 184, 185, 190, 195, 200, 202, 206, 207, 208, 209, 214, 216, 221, 224, 225, 242, 251, 254, 255, 259, 264, 266, 268, and 269.

Also, examples of a material that is reactive to blue color (approximately 400 to 490 nm) may include naphthalene derivatives, anthracene derivatives, naphthacene derivatives, styrylamine derivatives and bis(azinyl)methene boron complexes. Furthermore, examples of a material that is reactive to red color (approximately 580 to 700 nm) may include Nile red, pyran derivatives such as DCM1 {4-(dicyanomethylene)-2-methyl-6-(4-dimethylaminostyryl) 4H-pyran} and DCJT {4-(dicyanomethylene)-2-tert-butyl-6-(julolidylstyryl)pyran}, squarylium derivatives, porphyrin derivatives, chlorin derivatives, and eurodiline derivatives.

It is noted that the organic photoelectric conversion layer 3 can be formed with a combination of two or more organic semiconductor materials. In that case, the organic photoelectric conversion layer 3 may have a bulk hetero structure in which a p-type organic semiconductor material and an n-type organic semiconductor material are mixed.
[Buffer Layer 4]
The buffer layer 4 is disposed between the organic photoelectric conversion layer 3 and the electrode 2 on which light is incident, and forms an energy barrier. The buffer layer 4 of the photoelectric conversion element 10 according to the present embodiment is formed with an amorphous inorganic material, and has an energy level of 7.7 to 8.0 eV and a difference in a HOMO energy level from the organic photoelectric conversion layer of 2 eV or more.

When the inorganic material forming the buffer layer 4 is amorphous, stress inside the film is reduced, and an intermediate level is prevented from being formed during the lamination of the device. Thus, dark currents can be readily suppressed. The organic photoelectric conversion layer 3 can be prevented from being damaged during formation of the buffer layer 4. Also, when the energy level is 7.7 to 8.0 eV, and the difference in an HOMO energy level from the organic photoelectric conversion layer is 2 eV or more, an energy barrier becomes higher than in the past. Thus, dark currents can be suppressed.

An example of the inorganic material forming such a buffer layer 4 may include metal oxides, and particularly preferably includes a metal oxide semiconductor. Specifically, the buffer layer 4 is preferably formed with two or more metal oxides. It is preferable that at least one of the metal oxides be a metal oxide semiconductor. Accordingly, there can be achieved a buffer layer that is excellent in transparency and has a high energy barrier.

Here, examples of metal oxides used in the buffer layer 4 may include zinc oxide, silicon oxide, tin oxide, niobium oxide, titanium oxide, molybdenum oxide, aluminum oxide, In—Ga—Zn-based oxides (IGZO), magnesium oxide and hafnium oxide, and preferably a combination thereof. Particularly, from the viewpoint of transparency, a high energy barrier and easiness of formation, the buffer layer 4 is preferably formed with zinc oxide and aluminum oxide.

Also, it is preferable that the buffer layer 4 be formed with a transparent material, and have a relative refractive index to the electrode 2 of 0.3 or less. When the relative refractive index to the electrode 2 is 0.3 or less, scattering of incident light is suppressed. Thus, incidence efficiency on the organic photoelectric conversion layer 3 can be increased.

On the other hand, the thickness of the buffer layer 4 is, but not particularly limited to, preferably 3 to 300 nm, from the viewpoint of the incident light amount on the organic photoelectric conversion layer 3 and the setting of a film thickness in terms of an optical design in the laminated structure with the organic photoelectric conversion layer 3. Also, the surface resistance of the buffer layer 4 is preferably 100 kΩ/□ or more, from the viewpoint of the securement of insulation.

[Substrate]

The previously-described electrodes 1 and 2, organic photoelectric conversion layer 3 and buffer layer 4 can be formed, for example, on a substrate. The substrate (not illustrated) may be any substrate that can support these layers, and the material properties and shape of the substrate are not particularly limited. Examples of a material that constitutes the substrate may include synthetic resins such as polymethyl methacrylate (PMMA), polyvinyl alcohol (PVA), polyvinyl phenol (PVP), polyether sulfone (PES), polyimide, polycarbonate (PC), polyethylene terephthalate (PET) and polyethylene naphthalate (PEN).

When the substrate is formed with synthetic resins, the form thereof may be a film, a sheet, and the like, as well as a plate. Moreover, the use of a substrate having flexibility enables, for example, an electronic device to be incorporated or integrated into an electronic apparatus having a curved surface. Also, the substrate may be formed with an inorganic material such as mica, glass and quartz. Furthermore, as the substrate, there can be used, for example, a product obtained by forming an insulating film including silicon oxide, silicon oxynitride, aluminum oxide, metal oxides, metal salts, or the like, on the surface of various glass substrates, quartz substrates, silicon substrates, metal substrates, carbon substrates, or the like.

Moreover, for example, when light is received on the substrate side, the substrate is preferably formed with a transparent material it is noted that although the surface of the substrate is preferably smooth, it may be uneven to a degree that does not influence the characteristics of the organic photoelectric conversion layer 3. Also, the surface of the substrate may be subjected to a surface treatment for improving adhesion with an electrode formed on the substrate.

[Other Layers]

The photoelectric conversion element 10 according to the present embodiment may include a buffer layer, shock-absorbing layer and the like including an organic material, in addition to the previously-described electrodes 1 and 2, organic photoelectric conversion layer 3 and buffer layer 4, The organic buffer layer is disposed on the upper or lower surface of the buffer layer 4, and can be formed by a method of deposition, spraying, coating, printing, or the like. The use of a combination of this organic buffer layer and the previously-described buffer layer 4 enables the effects by a buffer layer of promoted carrier injection and a hole injection barrier to be further improved.

The shock-absorbing layer is disposed between the electrode 2 and the buffer layer 4, and disposed for relaxing stresses generated in the lower layers such as the electrode 1, the organic photoelectric conversion layer 3, the buffer layer 4 and the like during the formation of the electrode 2. The shock-absorbing layer can be formed with, for example, an organic material, by a method of deposition, spraying, coating, printing or the like. The disposition of this shock-absorbing layer enables durability and reliability of the photoelectric conversion element 10 to be improved.

[Manufacturing Method]

When manufacturing the photoelectric conversion element 10 according to the present embodiment, a step of forming the lower electrode 1, a step of forming the organic photoelectric conversion layer 3, a step of forming the buffer layer 4, and a step of forming the upper electrode 2 are performed in this order.

(Step of Forming Lower Electrode 1)

The forming method of the electrode 1 is not particularly limited, and can be appropriately selected depending on an electrode material. Specifically, examples of the forming method of the electrode 1 may include a physical vapor deposition method (PVD method) such as a vacuum vapor deposition method, a reactive vapor deposition method, various sputtering methods, an electron beam vapor deposition method and an ion plating method, various chemical vapor deposition methods (CVD methods) including a pyrosol method, a method of thermally decomposing an organometallic compound, a spray method, a dip method and an MOCVD method, and various plating methods such as an electroless plating method and an electrolytic plating method, a lift-off method, a sol-gel method, an electrodeposition method, and a shadow mask method. A combination of these may be performed. Also, these techniques and a patterning technique may be combined.

(Step of Forming Organic Photoelectric Conversion Layer 3)

The forming method of the organic photoelectric conversion layer 3 is not particularly limited. Various CVD methods including a coating method, a PVD method, and an MOCVD method can be applied. Here, examples of the coating method may include a spin coating method, a dipping method, a cast method, various printing methods such as a screen printing method, an ink-jet printing method, an offset printing method and a gravure printing method, and various coating methods such as a stamp method, a spray method, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method and a calendar coater method. At that time, as a solvent, there can be used non-polar or low polar organic solvents such as toluene, chloroform, hexane, and ethanol.

Also, examples of the PVD method may include a vacuum vapor deposition method using various heating methods such as an electron beam heating method, a resistance hearing method, a lamp heating method and a high-frequency induction heating method, a plasma vapor deposition method, various sputtering methods such as a bipolar sputtering method, a direct current sputtering method, a direct current magnetron sputtering method, a high-frequency sputtering method, a magnetron sputtering method, an ion beam sputtering method and a bias sputtering method, a DC (direct current) method, an RF method, a multi-cathode method, an activated reactive method, an electric field vapor deposition method, and various ion plating methods such as a high-frequency ion plating method and a reactive ion plating method. Furthermore, when integrating the light-receiving element according to the present embodiment, a method of forming a pattern on the basis of a pulsed laser deposition (PLD) method can be adopted.

(Step of Forming Buffer Layer 4)

The buffer layer 4 can be formed with the previously-described materials by, for example, a sputtering method. At that time, a film may be formed with a target which contains oxygen. However, a film is desirably formed while introducing oxygen in order to stably ensure the transparency of the buffer layer 4. At that time, the amount of oxygen to be introduced is, but not particularly limited to, preferably 2% or less. Even when the oxygen concentration is excessively increased, the obtained transmittance of the buffer layer does not decrease. Rather, the organic photoelectric conversion element is damaged in some cases.

(Step of Forming Upper Electrode 2)

The upper electrode 2 can be formed in a similar manner to the previously-described lower electrode 1. Therefore, description about a specific method thereof will be omitted.

The conventional organic photoelectric conversion element usually includes a buffer layer formed with an organic material. For this reason, an injection barrier cannot be sufficiently formed, causing dark currents to increase. On the contrary, the photoelectric conversion element according to the present embodiment includes a buffer layer formed with an amorphous inorganic material. Therefore, there can be achieved a buffer layer having excellent transparency and high potential energy without damaging the organic photoelectric conversion layer. As a result, a high energy barrier can be formed. This enhances the suppression effect of dark currents and improves pressure resistance.

The photoelectric conversion element according to the present embodiment can achieve various optical sensor elements such as a highly sensitive imaging element and an infrared sensor. The photoelectric conversion element according to the present embodiment is particularly suitable as an imaging element.

2. Second Embodiment

Figure 2:
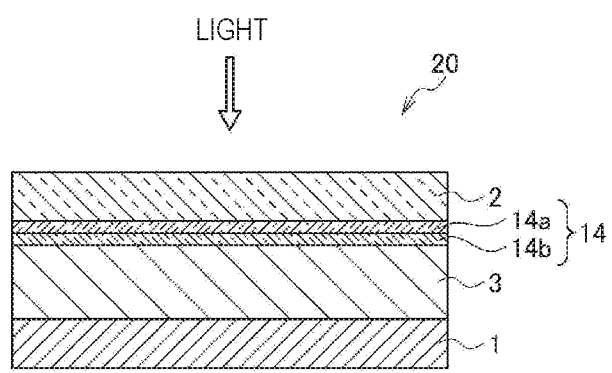
FIG. 2 is a schematic diagram illustrating a configuration of a photoelectric conversion element according to a second embodiment of the present disclosure.

Next, a photoelectric conversion element according to a second embodiment of the present disclosure will be described. FIG. 2 is a cross-sectional diagram schematically illustrating a configuration of the photoelectric conversion element according to the second embodiment of the present disclosure. It is noted that in FIG. 2, a constituent which is the same as that of the photoelectric conversion element 10 in FIG. 1 is assigned with the same reference numeral, and description thereof will be omitted. As illustrated in FIG. 2, a photoelectric conversion element 20 according to the present embodiment is similar to the previously-described photoelectric conversion element 10 according to the first embodiment, except that a buffer layer 14 is constituted by a plurality of layers each having a different energy level.

[Buffer Layer 14]

Each of inorganic buffer layers 14a and 14b constituting the buffer layer 14 contains one or two or more inorganic materials, and has a different energy level from each other. Accordingly, a high energy harrier is formed so that a hole injection barrier can be established, in a similar manner to the previously-described photoelectric conversion element according to the first embodiment. Thus, dark currents can be suppressed. It is noted that as an inorganic material to be contained in each of the inorganic buffer layers 14a and 14b, materials similar to those of the previously-described buffer layer 4 of the photoelectric conversion element 10 according to the first embodiment can be used.

Also, in the case of the laminated structure, the buffer layer 14 preferably has a thickness of 3 to 300 nm and a surface resistance of 100 kΩ/□ or more, in a similar manner. As described herein, the thickness and surface resistance are not the thickness of each layer, but the value for the whole laminated buffer layer.

The photoelectric conversion element 20 according to the present embodiment includes the buffer layer 14 which is constituted by two or more inorganic buffer layers 14a and 14b each having a different energy level. Accordingly, an injection barrier is formed in a reliable and step-wise manner compared to in the case of a one-layer structure. Thus, hole injection can be effectively suppressed. Also, in the photoelectric conversion element 20 according to the present embodiment, carrier injection is performed in a step-wise and smooth manner. Therefore, deactivation of electron injection can also be suppressed. It is noted that the configuration and effect other than the above in the photoelectric conversion element 20 according to the present embodiment are similar to those in the previously-described first embodiment. Also, the photoelectric conversion element according to the present embodiment is suitable as various optical sensors such as an imaging element and an infrared sensor.

3. Third Embodiment

[Configuration]

Figure 3:
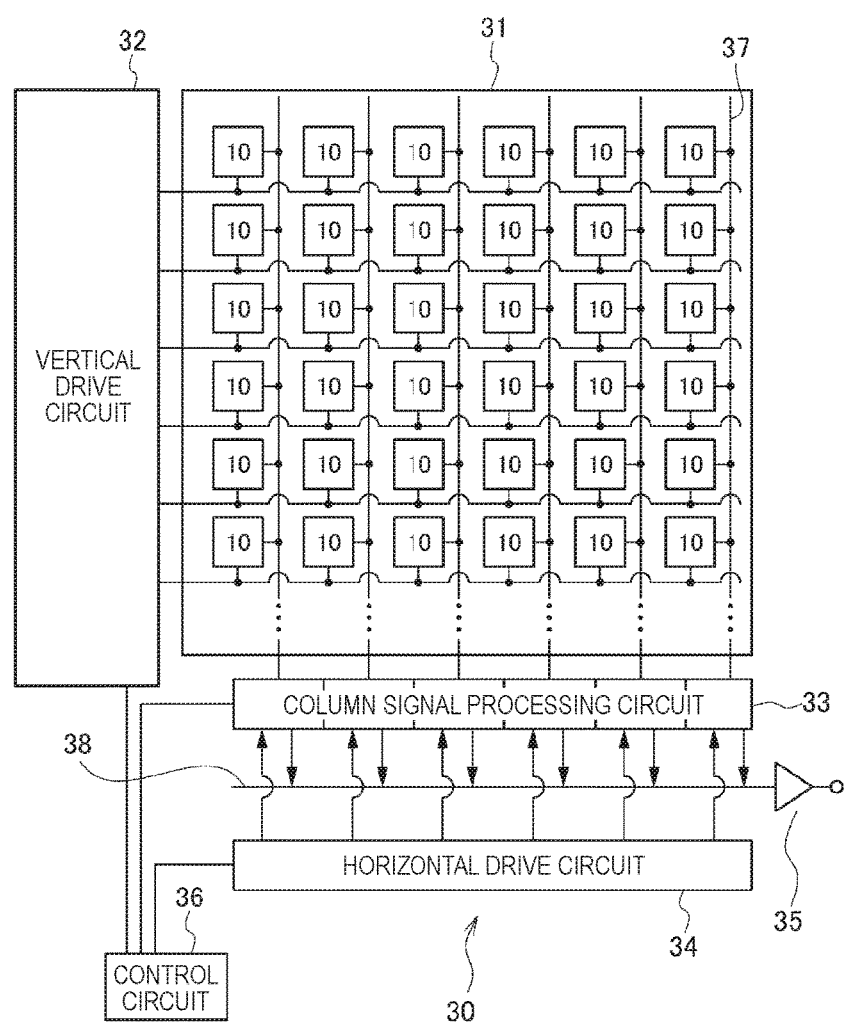
FIG. 3 is a schematic diagram illustrating a configuration of an imaging element according to a third embodiment of the present disclosure.

Next, an imaging device according to a third embodiment of the present disclosure will be described. The imaging device according to the present embodiment includes as an imaging element the previously-described photoelectric conversion element 10 or 20 according to the first or second embodiment. FIG. 3 is a diagram schematically illustrating a configuration of the imaging device according to the present embodiment. It is noted that although the photoelectric conversion element 10 according to the first embodiment is used in FIG. 3, an imaging device 30 according to the present embodiment may include the photoelectric conversion element 20 according to the second embodiment in place of the photoelectric conversion element 10.

As illustrated in FIG. 3, the imaging device 30 according to the present embodiment includes a plurality of photoelectric conversion elements 10 in a matrix shape, for example, on a semiconductor substrate such as an Si substrate. The region in which these photoelectric conversion elements 10 are arranged functions as an imaging region 31. It is noted that when integrating the previously-described photoelectric conversion element 10 or 20 according to the first or second embodiment, a method of forming a pattern on the basis of a pulsed laser deposition (PLD) method or the like can be adopted, Also, the imaging device 30 according to the present embodiment includes, as peripheral circuits of the imaging region 31, a vertical drive circuit 32, a column signal processing circuit 33, a horizontal drive circuit 34, an output circuit 35, a control circuit 36, and the like.

The control circuit 36 generates a clock signal and a control signal which serve as criteria for actions by the vertical drive circuit 32, the column signal processing circuit 33, and the horizontal drive circuit 34, on the basis of a vertical synchronization signal, a horizontal synchronization signal, and a master clock. The clock signal and control signal generated in this control circuit 36 are inputted to the vertical drive circuit 32, the column signal processing circuit 33 and the horizontal drive circuit 34.

The vertical drive circuit 32 is constituted by, for example, a shift register, and selectively scans each of the photoelectric conversion elements 10 in the imaging region 31 row by row sequentially in a vertical direction. A pixel signal based on a current (signal) generated in the vertical drive circuit 32 according to the received light amount in each of the photoelectric conversion elements 10 is transmitted to the column signal processing circuit 33 via a vertical signal line 37.

The column signal processing circuit 33 is disposed, for example, for each column of the photoelectric conversion elements 10, and performs signal processing of noise removal and signal amplification to signals outputted from a row of the photoelectric conversion elements 10 for each photoelectric conversion element with signals from black reference pixels (not illustrated, formed around an effective pixel region). Also, in an output stage of the column signal processing circuit 33, a horizontal selection switch (not illustrated) is connected between the column signal processing circuit 33 and a horizontal signal line 38.

The horizontal drive circuit 34 is constituted by, for example, a shift resistor. Then, in this horizontal drive circuit 34, a horizontal scanning pulse is sequentially outputted thereby to sequentially select each of the column signal processing circuits 33, and a signal is outputted from each of the column signal processing circuit 33 to the horizontal signal line 38.

The output circuit 35 performs signal processing to the signal sequentially supplied from each of the column signal processing circuits 33 via the horizontal signal line 38, and outputs the resultant signal.

These circuits can be constituted by known circuits. Also, the circuit configuration in the imaging device 30 according to the present embodiment is not limited to the previously-described configuration, and other circuit configurations such as various circuits which are used in, for example, a conventional CCD imaging device and a CMOS imaging device may be used.

The imaging device according to the present embodiment includes the first and second photoelectric conversion elements in which dark currents are suppressed. Therefore, there can be achieved an organic photoelectric conversion device having higher sensitivity and pressure resistance than conventional devices. It is noted that the previously-described first and second photoelectric conversion elements 10 and 20 can also be used, other than in the previously-described imaging device 30, in various optical sensors such as an infrared sensor.

Additionally, the present technology may also be configured as below.

(1)

A photoelectric conversion element, including:
a first electrode;
an organic photoelectric conversion layer disposed in a layer upper than the first electrode, the organic photoelectric conversion layer including one or two or more organic semiconductor materials;
a buffer layer disposed in a layer upper than the organic photoelectric conversion layer, the buffer layer including an amorphous inorganic material and having an energy level of 7.7 to 8.0 eV and a difference in a HOMO energy level from the organic photoelectric conversion layer of 2 eV or more; and
a second electrode disposed in a layer upper than the buffer layer.

(2)

The photoelectric conversion element according to (therein the buffer layer is formed with two or more metal oxides.

(3)

The photoelectric conversion element according to (2), wherein at least one of the metal oxides is a metal oxide semiconductor.

(4)

The photoelectric conversion element according to any one of (1) to (3), wherein the buffer layer is formed with two or more metal oxides selected from the group consisting of zinc oxide, silicon oxide, tin oxide, niobium oxide, titanium oxide, molybdenum oxide, aluminum oxide, In—Ga—Zn-based oxides (IGZO), magnesium oxide and hafnium oxide.

(5)

The photoelectric conversion element according to any one of (1) to (4), wherein the buffer layer is constituted by a plurality of layers each having a different energy level.

(6)

The photoelectric conversion element according to any one of (1) to (5), wherein the buffer layer has a thickness of 3 to 300 nm.

(7)

The photoelectric conversion element according to any one of (1) to (6), wherein the buffer layer has a surface resistance of 100 k$\Omega$/□ or more.

(8)

The photoelectric conversion element according to any one of (1) to (7), wherein the second electrode is formed with a transparent material.

(9)

The photoelectric conversion element according to (8), wherein the buffer layer is formed with a transparent material, and has a relative refractive index to the second electrode of 0.3 or less.

(10)

The photoelectric conversion element according to any one of (1) to (9), wherein the buffer layer is formed by a sputtering method.

(11)

An imaging device including the photoelectric conversion element according to any one of (1) to (10).

(12)

An optical sensor including the photoelectric conversion element according to any one of (1) to (10).

(13)

The optical sensor according to (12), which is an infrared sensor.

(14)

A method of manufacturing a photoelectric conversion element, the method including:

a step of forming a first electrode;

a step of forming, in a layer upper than the first electrode, an organic photoelectric conversion layer including one or two or more organic semiconductor materials;

a step of forming, in a layer upper than the organic photoelectric conversion layer, a buffer layer including an amorphous inorganic material and having an energy level of 7.7 to 8.0 eV and a difference in a HOMO energy level from the organic photoelectric conversion layer of 2 eV or more; and a step of forming, in a layer upper than the buffer layer, a second electrode.

(15)

The method of manufacturing the photoelectric conversion element according to (14), including forming the buffer layer by a sputtering method.

(16)

The method of manufacturing the photoelectric conversion element according to (15), including forming a film of the buffer layer while introducing Oxygen.

It is noted that the effects described herein are merely exemplary and not limiting, and other effects may exist.

[Examples]

Hereinafter, the effects of the present invention will be specifically described with reference to examples of the present invention. In the present examples, zinc oxide (ZnO) as a main component (content: 50% by mass or more) and $Al_2O_3$, $SiO_2$, MgO and $SnO_2$ as an auxiliary component were used to form buffer layers of Sample Nos. 1 to 4 indicated in Table 1 below. The evaluation results of the buffer layers are indicated in Table 2 below

TABLE 1

| Sample No. | Main component | Auxiliary component | |
|---|---|---|---|
| 1 | ZnO | $Al_2O_3$ | $SiO_2$ |
| 2 | ZnO | $Al_2O_3$ | MgO |
| 3 | ZnO | $Al_2O_3$ | $SnO_2$ |
| 4 | ZnO | MgO | $SiO_2$ |

TABLE 2

| | No. 1 | No. 2 | No. 3 | No. 4 |
|---|---|---|---|---|
| I.P. (eV) | 7.8 | 7.8 | 7.7 | 7.7 |
| Eg. (eV) | 3.1 | 3.0 | 2.9 | 3.0 |
| Conduction Band (eV) | 4.7 | 4.8 | 4.8 | 4.7 |
| ΔE | 2.1 | 2.1 | 2.0 | 2.0 |

It is noted that ionization potential (I.P.) indicated in Table 2 above was obtained by ultraviolet photoelectron spectroscopy (UPS). Also, band gap (Eg) was calculated from an absorption edge. Furthermore, ΔE is a difference between the HOMO value of a photoelectric conversion layer and the ionization potential (I.P.) (ΔE=photoelectric conversion layer HOMO—I.P.) of each buffer layer.

Figure 4:
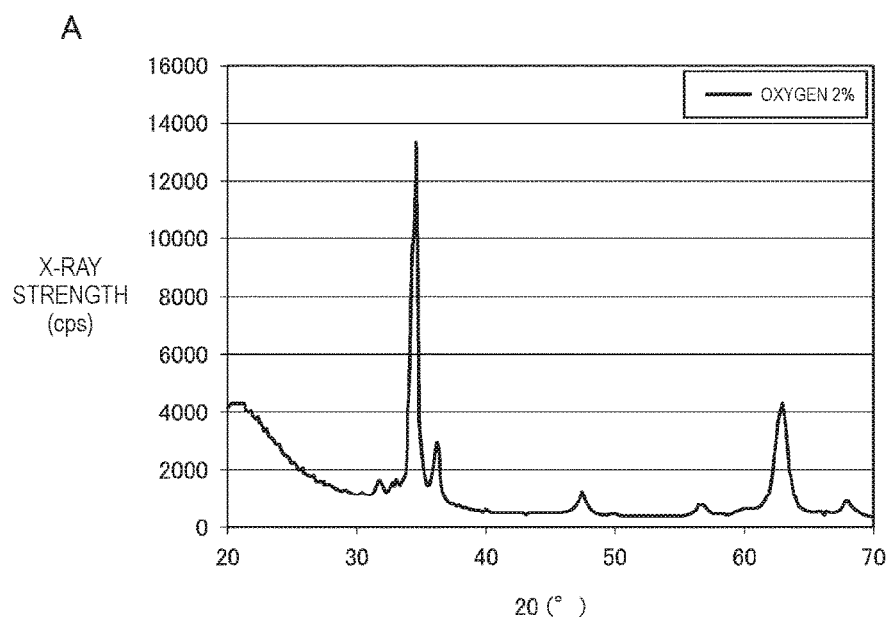
FIG. 4A illustrates an X-ray diffraction spectrum of a film including crystalline ZnO.
FIG. 4B illustrates X-ray diffraction spectra of buffer layers of Sample Nos. 1 and 2.
Figure 4:
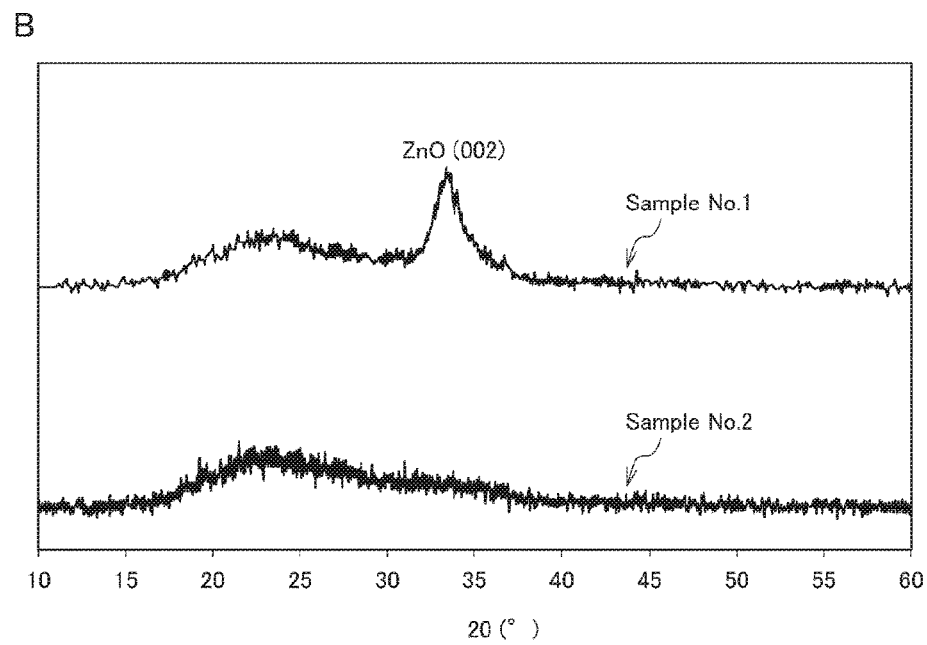

FIG. 4A illustrates an X-ray diffraction spectrum of a film including crystalline ZnO, and FIG. 4B illustrates X-ray diffraction spectra of the buffer layers of Sample Nos. 1 and 2. A peak indicating crystallinity is observed in the spectrum of ZnO indicated in FIG. 4A. However, a peak indicating crystallinity is not observed for the buffer layers of Sample Nos. 1 and 2. This demonstrated that the buffer layers are amorphous.

Figure 5:
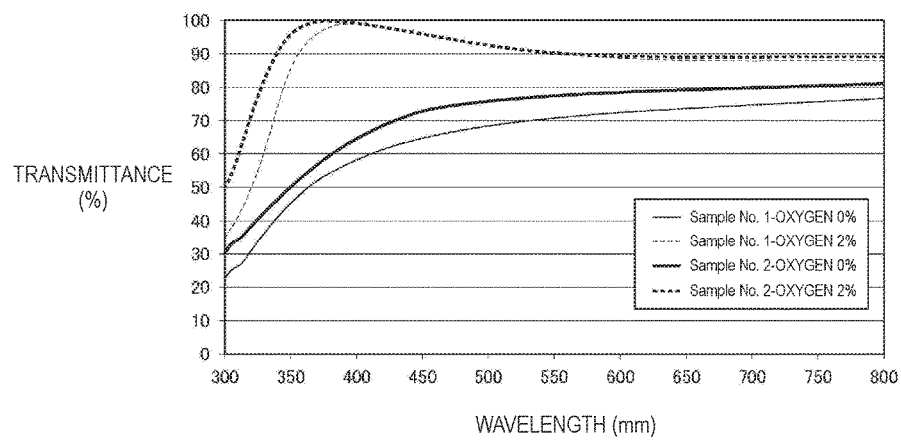
FIG. 5 is a diagram illustrating a relationship between oxygen concentrations and optical transparency.

Also, a film was formed with changed oxygen concentrations. The obtained buffer layer (film thickness: 100 nm) was checked for optical transparency. FIG. 5 is a diagram illustrating a relationship between the oxygen concentrations during film formation and the transmittance properties of a buffer layer. As illustrated in FIG. 5, a buffer layer formed with introduced oxygen had higher optical transmittance than a buffer layer formed without introduced oxygen.

Figure 6:
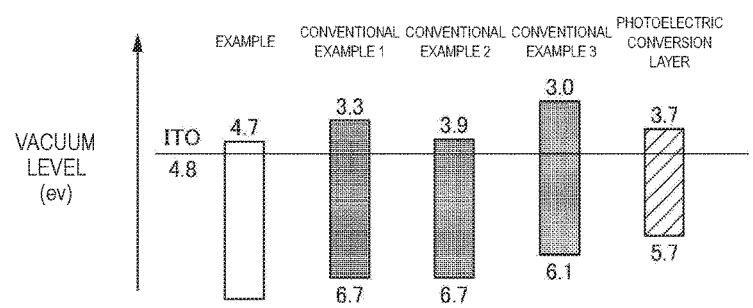
FIG. 6 is a diagram illustrating energy levels of buffer layers in an example and comparative examples.

FIG. 6 is a diagram for comparison among the energy level of the buffer layer of the previously-described example, the energy levels of conventional buffer layers including an organic material, and the energy level of an organic photoelectric conversion layer. As illustrated in FIG. 6, the buffer layer of the example (Sample No. 1) had a higher energy level than conventional buffer layers including an organic material, and the difference (ΔE) from the HOMO value of the photoelectric conversion layer was also 2 eV or more.

Figure 7:
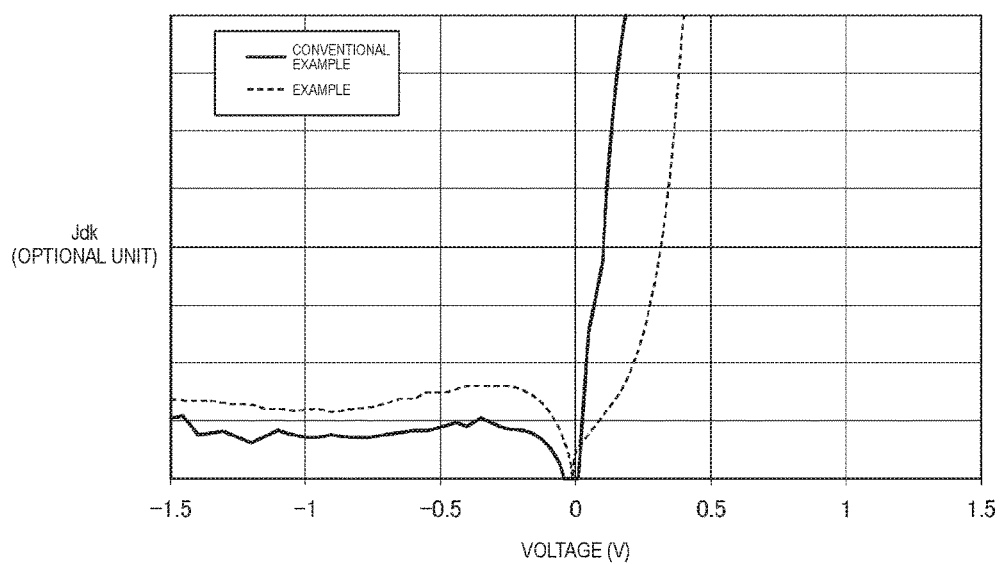
FIG. 7 is a diagram illustrating current characteristics of an example and a comparative example.

Also, the evaluation result of dark currents pressure resistance performance is indicated in Table 3 below. Furthermore, current properties of the buffer layers of an example and a comparative example are illustrated in FIG. 7.

TABLE 3

| | Jdk (−1 V) | Jdk (−3 V) | ΔJdk |
|---|---|---|---|
| Example 1 | $1.2 \times 10^{-10}$ | $2.0 \times 10^{-10}$ | $0.8 \times 10^{-10}$ |
| Example 2 | $1.3 \times 10^{-10}$ | $1.9 \times 10^{-10}$ | $0.6 \times 10^{-10}$ |
| Comparative Example 1 | $1.7 \times 10^{-10}$ | $3.4 \times 10^{-10}$ | $1.7 \times 10^{-10}$ |

The above results demonstrated that the buffer layers of Examples 1 and 2 are amorphous, and have a high energy level and improved pressure resistance properties. That is, it was confirmed that according to the present invention, a high energy barrier can be formed by the buffer layer to improve the suppression effect of dark currents.

REFERENCE SIGNS LIST 1, 2 electrode
3 organic photoelectric conversion layer
4, 14 buffer layer
10, 20 photoelectric conversion element
30 imaging device
31 imaging region
32 vertical drive circuit
33 column signal processing circuit
34 horizontal drive circuit
35 output circuit
36 control circuit
37 vertical signal line
38 horizontal signal line

What is claimed is:

1. A photoelectric conversion element, comprising:
a first electrode;
an organic photoelectric conversion layer disposed at a layer above the first electrode, the organic photoelectric conversion layer including one or more organic semiconductor materials;
a buffer layer disposed at a layer above the organic photoelectric conversion layer, the buffer layer including an amorphous inorganic material and having an energy level of 7.7 to 8.0 eV, wherein a difference in a highest occupied molecular orbital (HOMO) energy level from the organic photoelectric conversion layer and the buffer layer is 2 eV or more; and
a second electrode formed of a transparent material disposed at a layer above the buffer layer, wherein the buffer layer is formed with a transparent material having a relative refractive index with respect to the second electrode of 0.3 or less.

2. The photoelectric conversion element according to claim 1, wherein the buffer layer is formed with two or more metal oxides.

3. The photoelectric conversion element according to claim 2, wherein at least one of the metal oxides is a metal oxide semiconductor.

4. The photoelectric conversion element according to claim 2, wherein the buffer layer is formed with two or more metal oxides selected from the group consisting of zinc oxide, silicon oxide, tin oxide, niobium oxide, titanium oxide, molybdenum oxide, aluminum oxide, In—Ga—Zn-based oxides (IGZO), magnesium oxide and hafnium oxide.

5. The photoelectric conversion element according to claim 1, wherein the buffer layer includes a plurality of layers each having a different energy level.

6. The photoelectric conversion element according to claim 1, wherein the buffer layer has a thickness of 3 to 300 nm.

7. The photoelectric conversion element according to claim 1, wherein the buffer layer has a surface resistance of 100 kΩ/or more.

8. The photoelectric conversion element according to claim 1, wherein the buffer layer is formed by a sputtering method.

9. An imaging device comprising the photoelectric conversion element according to claim 1.

10. An optical sensor comprising the photoelectric conversion element according to claim 1.

11. The optical sensor according to claim 10, which is an infrared sensor.

12. A method of manufacturing a photoelectric conversion element, the method comprising:
forming a first electrode;
forming, as a layer above the first electrode, an organic photoelectric conversion layer including one or more organic semiconductor materials;
forming, as a layer above the organic photoelectric conversion layer, a buffer layer including an amorphous inorganic material and having an energy level of 7.7 to 8.0 eV, wherein a difference in a highest occupied molecular orbital (HOMO) energy level from the organic photoelectric conversion layer and the buffer layer is 2 eV or more; and
forming, as a layer above the buffer layer, a second electrode, wherein the second electrode is formed of a transparent material, and wherein the buffer layer is formed with a transparent material having a relative refractive index with respect to the second electrode of 0.3 or less.

13. The method of manufacturing the photoelectric conversion element according to claim 12, comprising forming the buffer layer by a sputtering method.

14. The method of manufacturing the photoelectric conversion element according to claim 13, comprising forming a film of the buffer layer while introducing oxygen.

15. A photoelectric conversion element, comprising:
a first electrode;
an organic photoelectric conversion layer disposed directly on the first electrode, the organic photoelectric conversion layer including one or more organic semiconductor materials;
a buffer layer disposed directly on the organic photoelectric conversion layer, the buffer layer including an amorphous inorganic material, the buffer layer having an energy level of 7.7 to 8.0 eV, and the buffer layer having a difference in a highest occupied molecular orbital (HOMO) energy level from the organic photoelectric conversion layer of 2 eV or more; and
a second electrode disposed directly on the buffer layer.

16. The photoelectric conversion element according to claim 15, wherein the buffer layer is formed with two or more metal oxides.

17. The photoelectric conversion element according to claim 16, wherein at least one of the metal oxides is a metal oxide semiconductor.

18. The photoelectric conversion element according to claim 16, wherein the buffer layer is formed with two or more metal oxides selected from the group consisting of zinc oxide, silicon oxide, tin oxide, niobium oxide, titanium oxide, molybdenum oxide, aluminum oxide, In—Ga—Zn-based oxides (IGZO), magnesium oxide and hafnium oxide.

19. The photoelectric conversion element according to claim 15, wherein the buffer layer includes a plurality of layers each having a different energy level.

20. The photoelectric conversion element according to claim 15, wherein the buffer layer has a thickness of 3 to 300 nm.

* * * * *